United States Patent
Kapoor

(10) Patent No.: US 7,651,905 B2
(45) Date of Patent: Jan. 26, 2010

(54) APPARATUS AND METHOD FOR REDUCING GATE LEAKAGE IN DEEP SUB-MICRON MOS TRANSISTORS USING SEMI-RECTIFYING CONTACTS

(75) Inventor: Ashok Kumar Kapoor, Palo Alto, CA (US)

(73) Assignee: Semi Solutions, LLC, Los Gatos, CA (US)

( * ) Notice: Subject to any disclaimer, the term of this patent is extended or adjusted under 35 U.S.C. 154(b) by 647 days.

(21) Appl. No.: 11/110,457

(22) Filed: Apr. 19, 2005

(65) Prior Publication Data

US 2006/0151842 A1 Jul. 13, 2006

Related U.S. Application Data

(60) Provisional application No. 60/643,071, filed on Jan. 12, 2005.

(51) Int. Cl.
| | |
|---|---|
| *H01L 21/8234* | (2006.01) |
| *H01L 21/336* | (2006.01) |
| *H01L 21/8238* | (2006.01) |
| *H01L 27/10* | (2006.01) |
| *H01L 29/739* | (2006.01) |
| *H01L 29/76* | (2006.01) |
| *H01L 29/94* | (2006.01) |
| *H01L 31/062* | (2006.01) |
| *H01L 31/113* | (2006.01) |
| *H01L 31/119* | (2006.01) |

(52) U.S. Cl. .................... 438/237; 438/197; 438/200; 438/279; 257/202; 257/331; 257/341; 257/390; 257/401; 257/903; 257/905; 257/909; 257/E21.359; 257/E21.368; 257/E27.068; 257/E29.041; 257/E29.338

(58) Field of Classification Search ............... 257/202, 257/331, 341, 390, 401, 903, 905, 909, E21.359, 257/E21.368, E27.068, E29.041, E29.338; 438/197, 200, 279, 237
See application file for complete search history.

(56) References Cited

U.S. PATENT DOCUMENTS 3,921,035 A 11/1975 Holmes ..................... 315/307

(Continued)

FOREIGN PATENT DOCUMENTS

TW 419854 1/2001

(Continued)

OTHER PUBLICATIONS

Bohr, M. High Performance Logic Technology and Reliability Challenges. 2003 IPRS. Apr. 1, 2003.

(Continued)

*Primary Examiner*—Ida M Soward
(74) *Attorney, Agent, or Firm*—Michael A. Glenn; Glenn Patent Group

(57) ABSTRACT

An apparatus and method for the reduction of gate leakage in deep sub-micron metal oxide semiconductor (MOS) transistors, especially useful for those used in a cross coupled static random access memory (SRAM) cell, is disclosed. In accordance with the invention, the active element of the SRAM cell is used to reduce the voltage on the gate of its transistor without impacting the switching speed of the circuit. Because the load on the output of the inverter is fixed, a reduction in the gate current is optimized to minimize the impact on the switching waveform of the memory cell. An active element formed by two materials with different Fermi potentials is used as a rectifying junction or diode. The rectifying junction also has a large parallel leakage path, which allows a finite current flow when a signal of opposite polarity is applied across this device.

11 Claims, 5 Drawing Sheets

U.S. PATENT DOCUMENTS

| | | | |
|---|---|---|---|
| 4,412,308 A | | 10/1983 | Bereron |
| 4,418,468 A | * | 12/1983 | Vora et al. ................ 438/328 |
| 4,616,404 A | * | 10/1986 | Wang et al. ............... 438/491 |
| 4,679,170 A | * | 7/1987 | Bourassa et al. ........... 365/154 |
| 5,168,337 A | * | 12/1992 | Muto et al. .................... 257/49 |
| 5,266,831 A | * | 11/1993 | Phipps et al. ............... 257/620 |
| 5,365,102 A | | 11/1994 | Mehrotra et al. |
| 5,416,443 A | | 5/1995 | Cranford et al. ............... 331/2 |
| 5,559,451 A | | 9/1996 | Okamura ..................... 326/84 |
| 5,717,237 A | * | 2/1998 | Chi ............................ 257/315 |
| 5,753,955 A | | 5/1998 | Fechner |
| 5,760,449 A | * | 6/1998 | Welch ....................... 257/369 |
| 5,763,960 A | | 6/1998 | Ceccherelli et al. .......... 307/41 |
| 5,804,470 A | * | 9/1998 | Wollesen .................... 438/141 |
| 5,821,769 A | | 10/1998 | Douseki ...................... 326/34 |
| 5,856,708 A | * | 1/1999 | Wollesen ................... 257/536 |
| 6,018,168 A | | 1/2000 | Yang ........................... 257/20 |
| 6,034,563 A | | 3/2000 | Mashiko ..................... 327/544 |
| 6,081,107 A | | 6/2000 | Marino ....................... 323/282 |
| 6,177,703 B1 | * | 1/2001 | Cunningham ............... 257/321 |
| 6,194,276 B1 | * | 2/2001 | Chan et al. .................. 438/294 |
| 6,198,173 B1 | * | 3/2001 | Huang ........................ 257/536 |
| 6,204,105 B1 | * | 3/2001 | Jung .......................... 438/238 |
| 6,225,827 B1 | | 5/2001 | Fujii et al. .................... 326/98 |
| 6,232,163 B1 | * | 5/2001 | Voldman et al. ............ 438/212 |
| 6,294,816 B1 | | 9/2001 | Baukus et al. ............... 257/368 |
| 6,359,477 B1 | * | 3/2002 | Pathak ........................ 327/112 |
| 6,384,639 B1 | | 5/2002 | Chen et al. .................... 327/88 |
| 6,411,560 B1 | | 6/2002 | Tanizaki et al. ............. 365/227 |
| 6,429,482 B1 | * | 8/2002 | Culp et al. .................. 257/345 |
| 6,441,647 B2 | | 8/2002 | Jeon ............................ 326/98 |
| 6,465,849 B1 | | 10/2002 | Chang et al. ................ 257/369 |
| 6,521,948 B2 | | 2/2003 | Ebina ......................... 257/347 |
| 6,593,799 B2 | * | 7/2003 | De et al. ...................... 327/534 |
| 6,600,187 B2 | * | 7/2003 | Kim ........................... 257/296 |
| 6,621,292 B2 | | 9/2003 | Sakata et al. .................. 326/34 |
| 6,628,551 B2 | | 9/2003 | Jain ........................... 365/387 |
| 6,643,199 B1 | | 11/2003 | Tang et al. .................. 365/204 |
| 6,645,820 B1 | * | 11/2003 | Peng et al. .................. 438/372 |
| 6,674,123 B2 | | 1/2004 | Kim ........................... 257/328 |
| 6,690,039 B1 | | 2/2004 | Nemati et al. ............... 257/133 |
| 6,693,333 B1 | * | 2/2004 | Yu .............................. 257/407 |
| 6,707,708 B1 | | 3/2004 | Alvandpour et al. ........ 365/154 |
| 6,711,063 B1 | | 3/2004 | Dejenfelt et al. ....... 365/185.21 |
| 6,711,088 B2 | | 3/2004 | Hayashi et al. ........ 365/230.06 |
| 6,787,850 B1 | | 9/2004 | Pelloie ........................ 257/347 |
| 6,891,389 B1 | * | 5/2005 | Walker et al. ............... 324/763 |
| 6,894,324 B2 | * | 5/2005 | Ker et al. ..................... 257/199 |
| 6,898,116 B2 | * | 5/2005 | Peng ........................... 365/177 |
| 6,940,317 B2 | | 9/2005 | Suga ........................... 327/65 |
| 6,958,519 B2 | | 10/2005 | Gonzalez et al. ............ 257/402 |
| 6,969,888 B2 | * | 11/2005 | Williams et al. ............ 257/341 |
| 7,064,942 B2 | | 6/2006 | Ker et al. ...................... 361/56 |
| 7,132,711 B2 | * | 11/2006 | Forbes et al. ................ 257/314 |
| 7,253,485 B2 | * | 8/2007 | Shibahara ................... 257/407 |
| 2001/0054886 A1 | | 12/2001 | Takahashi et al. ........... 323/282 |
| 2002/0096723 A1 | | 7/2002 | Awaka ........................ 357/360 |
| 2002/0153957 A1 | | 10/2002 | Jordanov .................... 330/308 |
| 2002/0154462 A1 | | 10/2002 | Ker et al. ...................... 361/56 |
| 2002/0195623 A1 | | 12/2002 | Horiuchi ........................ 623/7 |
| 2003/0089951 A1 | * | 5/2003 | Ker et al. ..................... 257/355 |
| 2003/0178648 A1 | | 9/2003 | Bonsal ........................ 257/202 |
| 2004/0004298 A1 | * | 1/2004 | Madurawe .................. 257/903 |
| 2004/0022109 A1 | * | 2/2004 | Yoon et al. .................. 365/205 |
| 2004/0077151 A1 | * | 4/2004 | Bhattacharyya ............. 438/400 |
| 2004/0252546 A1 | * | 12/2004 | Liaw .......................... 365/154 |
| 2005/0035410 A1 | * | 2/2005 | Yeo et al. .................... 257/355 |
| 2007/0114582 A1 | * | 5/2007 | Shiu et al. ................... 257/292 |

FOREIGN PATENT DOCUMENTS

| | | |
|---|---|---|
| TW | 479852 | 3/2002 |
| TW | 480773 | 3/2002 |
| TW | 495106 | 7/2002 |

OTHER PUBLICATIONS

Fallah, et al. Standby and Active Leakage Current Control and Minimization in CMOS VLSI Circuits. IEICE Trans. on Electronics, Special Section on Low-Power LSO and Low Power IP. vol. E88-C, No. 4, Apr. 2004.

Cao, et al. Reducing Dynamic Power and Leakage Power for Embedded Systems. ASIC-SOC Conference, 2002. 15th Annunal IEEE International vol. Uss. Sept. 2002.

Mln, et al. Zigzag Super Cut-Off CMOS (ZSCCMOS) Block Activation with Self-Adaptive Voltage Level Controller: An Alternative to Clock-Gating Scheme in Leakage Dominant Era. Solid-State Circuits Conference 2003. Digest of Technical Papers. ISSCC 2003 IEEE International vol. Iss 2003.

Henzler, et al. Fast Power-Efficient Circuit-Block Switch-Off Scheme. Electronics Letters, vol. 40. Iss 2. Jan. 22, 2004.

Narendra, et al. Full Chip Subthreshold Leakage Power Prediction and Reduction Techniques for sub-0.18um CMOS. Solid-State circuits. IEEE Journal of vol. 39. Iss.3. Mar. 2004.

Kao, et al. Dual-Threshold Voltage Techniques for Low-Power Digital Circuits. Solid-State Circuits. IEEE Journal. vol. 35. ISs. 7. Jul. 2000.

Kuroda, et al. A 0.9-V, 150MHz, 10-mW, 4mm2, 2-D Discrete Cosine Transform Core Processor with Variable Threshold-Voltage (VT) Scheme. Solid-State Circuits. IEEE Journal vol. 31. Iss. 11. Nov. 1996.

Tschanz, et al. Adaptive Body Bias for Reducing Impacts of Die-to-Die and within-die Parameter Variations on Microprocessor Frequency and Leakage. Solid State Circuits Conference. 2002. Digest of Technical Papers. ISSCC. 2002 IEEE International. vol. 1. Iss. Feb. 2002.

von Arnim, et al. Efficiency of Body Biasing in 90-nm CMOS for Low-Power Digital Circuits. Solid State Circuits. IEEE Journal. vol. 40. Iss. 7. Jul. 2005.

Borkar, S. Circuit Techniques for Subthreshold Leakage Avoidance, Control, and Tolerance. IEEE. 2004.

Vora, M., et al., "A 2 Micron High Performance Bipolar 64K ECL Static RAM Technology With 200 Square Microns Contactless Memory Cell," 1984, IEDM Technical Digest 1984, pp. 690-693.

Takamiya, M., et al., "High Performance Electrically Induced Body Dynamic Threshold SOI MOSFET (EIB-DTMOS) with Large Body Effect and Low Threshold Voltage," 1998, IEDM Technical Digest.

Diaz, C.H., et al., "Device Properties in 90nm and beyond and implications on Circuit Design," 2003, IEEE.

Rabaey, J., "Issues in Low Power Design—Managing Leakage," Aug. 23, 2004, Dept. of Electrical Engineering and Computer Sciences, University of California at Berkeley.

* cited by examiner

Figures

APPARATUS AND METHOD FOR REDUCING GATE LEAKAGE IN DEEP SUB-MICRON MOS TRANSISTORS USING SEMI-RECTIFYING CONTACTS

CROSS REFERENCE TO OTHER APPLICATIONS

This application claims priority to U.S. provisional patent application Ser. No. 60/643,071, filed Jan. 12, 2005, which application is incorporated herein its entirety by this reference thereto.

BACKGROUND OF THE INVENTION

1. Technical Field

The invention relates generally to gate leakage of MOS devices. More specifically, the invention relates to the reduction of gate leakage in MOS memory cells.

2. Discussion of the Prior Art

In the semiconductor manufacturing world the leading manufacturing processes are based on complementary metal-oxide semiconductor (CMOS) devices. The CMOS technology is in constant advancement, particularly by scaling down line widths, i.e., the minimal feature size for a given manufacturing technology, typically referred to as a process node. The decrease in feature size allows for improved performance of a CMOS device, evidenced by increased speed, reduced area, and increased functionality contained in a single chip. As line widths shrink it is generally observed that chip sizes are actually increasing. This happens because more functionality is packed onto these chips. Power dissipation is therefore one of the most pertinent problems of CMOS technology.

As the minimum feature size of a technology node is reduced so is the thickness of the gate oxide thickness as well as the power supply. The reduction of the power supply voltage is done to reduce the electrical field that develops across the oxide. For example, a typical 0.35 micron line width requires a power supply of 3.3V and gate oxide thickness of 70 Å; while in a 0.25 micron line width requires a 2.5V power supply and a 40 Å gate oxide thickness. Further reduction of the line width, for example to 90 nano-meters, requires the reduction of the power supply voltage to less than 1.0V and a further reduction of the gate oxide thickness. At these thicknesses of the gate oxide, significant tunneling current across the oxide is recorded. With the next generation of technology scaling to 65 nano-meters, a gate oxide thickness of less than 20 Å is used and the power supply voltage is further reduced to 0.7V. At this process node there is already recorded an extremely high level of gate current, causing concern that it has the potential of limiting the functionality of the CMOS technology.

It is known in the art that many solutions for reducing the gate current leakage are being sought, including the use of high dielectric constant insulators. However, no single solution has matured to provide production worthiness. A person skilled-in-the-art would further note that the problem caused by high leakage current through the gate oxide is found to be more severe in memory cells as compared to standard CMOS logic. In view of the limitations of the prior art, it would be advantageous to provide a solution to limit the gate current of CMOS transistors. It would be further advantageous if such a solution would be useful for the transistors used in memory cells, such as SRAM cells.

SUMMARY OF THE INVENTION

An apparatus and method for the reduction of gate leakage in deep sub-micron metal oxide semiconductor (MOS) transistors, especially useful for those used in a cross coupled static random access memory (SRAM) cell, is disclosed. The invention is further applicable in other instances where the gate leakage needs to be reduced. In accordance with the invention, the active element of the SRAM cell is used to reduce the voltage on the gate of its transistor without impacting the switching speed of the circuit. Because the load on the output of the inverter is fixed, a reduction in the gate current is optimized to minimize the impact on the switching waveform of the memory cell. An active element formed by two materials with different Fermi potentials is used as a rectifying junction or diode. The rectifying junction also has a large parallel leakage path, which allows a finite current flow when a signal of opposite polarity is applied across this device.

DETAILED DESCRIPTION OF THE INVENTION

The invention comprises a simple to implement apparatus and method for the reduction of gate leakage of deep sub-micron metal oxide semiconductor (MOS) transistors, especially those used in a cross coupled static random access memory (SRAM) cell. The invention is further applicable in other circuits where the gate leakage reduction is desirable or required. In accordance with the invention, the active element of the SRAM cell is used to reduce the voltage on the gate of its corresponding transistor without impacting the overall switching speed of the circuit. Because the load on the output of the inverter is fixed, a reduction in the gate current is optimized to minimize the impact on the switching waveform of the memory cell. An active element formed by two materials with different Fermi potentials is used as a rectifying junction, essentially performing a diode function. The rectifying junction also has a large parallel leakage path, which allows a finite current flow when a signal of opposite polarity is applied across the device.

Figure 1:
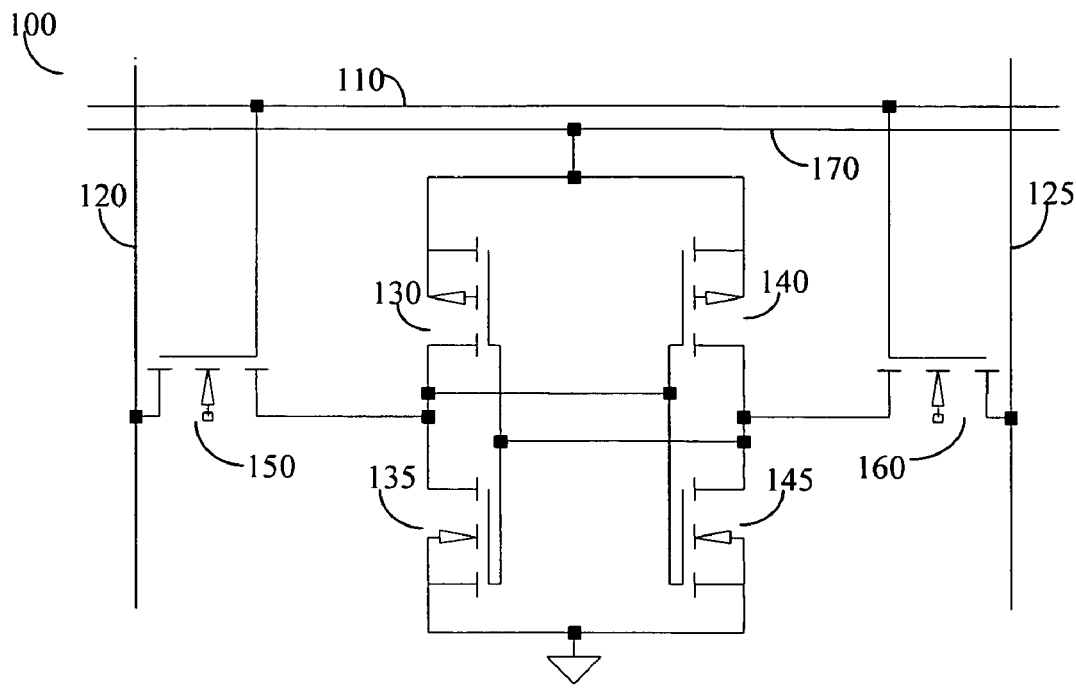
FIG. 1 shows cross-coupled CMOS inverters forming a SRAM cell.

In the case of an SRAM cell, two complementary MOS (CMOS) inverters are cross-coupled, and the load on the inverter is a single transistor which is used for accessing the inverter. A typical prior-art circuit 100 configuration used for an SRAM is shown in FIG. 1. The basic cell is comprised of two cross-coupled inverters, formed of transistors 130 and 135, and 140 and 145, respectively. Pass transistors 150 and 160 are used for accessing the inverters. By controlling the voltages on the gates of the pass transistors 150 and 160 by means of word line 110, it is possible to provide the data and its inverted value on the bit lines 120 and 125, respectively, or to read the data using the same bit lines. A person skilled-in-the-art would appreciate that in this circuit the load on transistors 130, 135, 140, 145, 150, and 160 is well defined in all instances of the design, a fact which is to be exploited to reduce the gate leakage in accordance with the principles of the disclosed invention.

Figure 2:
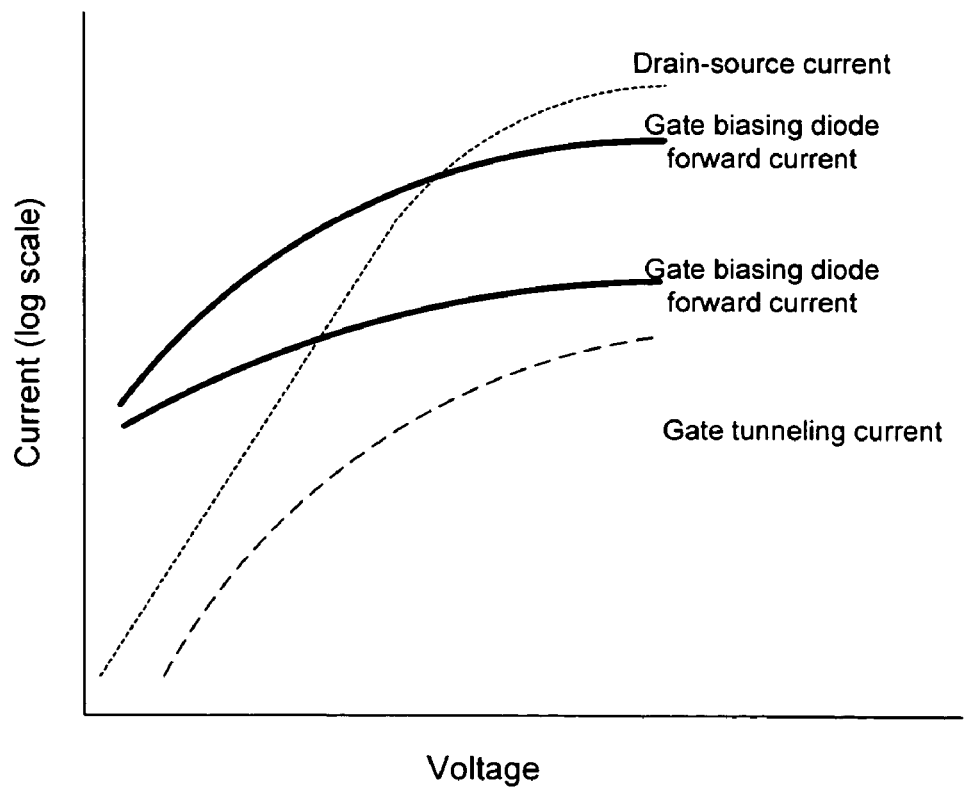
FIG. 2 shows a representative current—voltage characteristics of transistor drain current, gate tunneling current, and gate biasing forward and reverse biasing current.

The disclosed invention takes advantage of this property of the memory cell by using an active element to reduce the voltage on the gate of a transistor of the inverter, for example transistor 135, without impacting the switching speed of the circuit. An active element is formed by two materials having different Fermi potentials and is used as a rectifying junction or a diode. The rectifying junction also has a large parallel leakage path, which allows a finite current flow when a signal of opposite polarity is applied across this device. Exemplary, but not limiting embodiments of this rectifying junction include diodes made with N+ and P+ polysilicon with large leakage across the junction, a rectifying contact with a metal layer and a N type polysilicon layer, or a P type polysilicon layer and a metal layer of appropriate ionization potential with a significant leakage through the junction. In accordance with an exemplary embodiment of the invention there is shown, without limitation, a use of junctions with leakage current between 1 nA/µm2 and 1 mA/µm2 with 1 V bias across the junction. An exemplary and non-limiting graph of the pseudo-rectifying characteristics of a diode configured in accordance with the invention is shown in FIG. 2.

Figure 3:
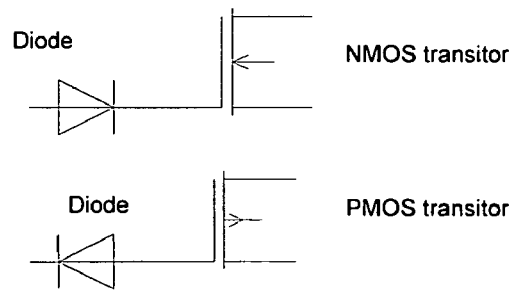
FIG. 3 shows a circuit configuration of NMOS and PMOS transistors with the diode connected to the gate, where the diode has very low forward drop and very high reverse current.
Figure 6A:
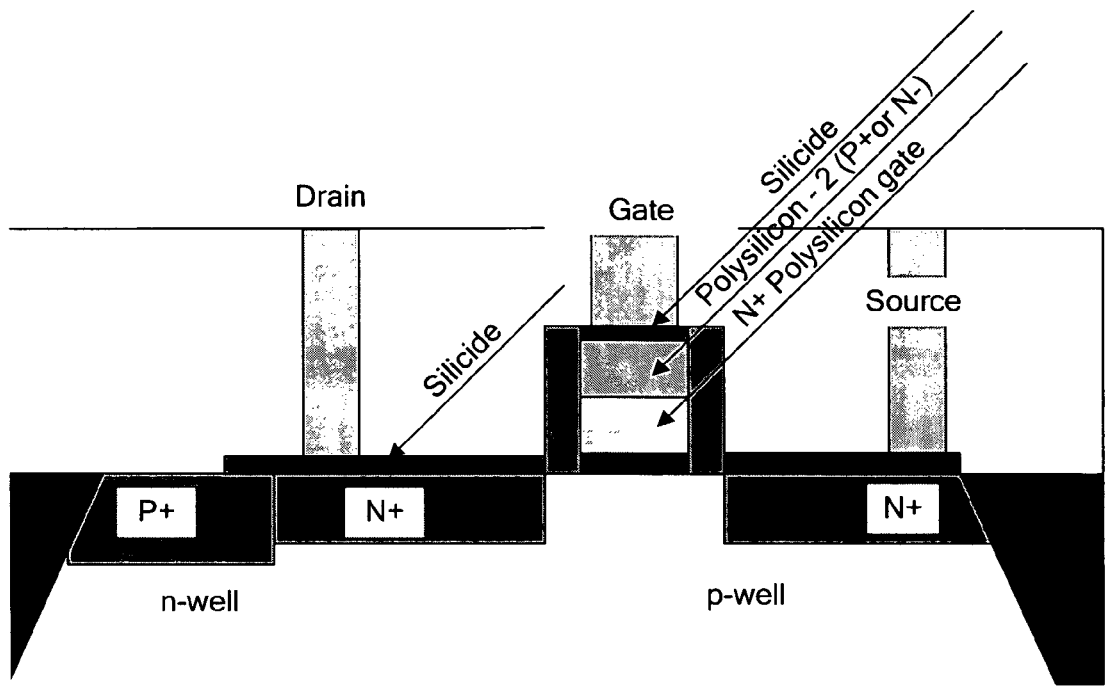
FIGS. 6A-6C shows the cross sections of NMOS and PMOS transistors having diodes in accordance with an exemplary implementation of the disclosed invention.
Figure 6B:
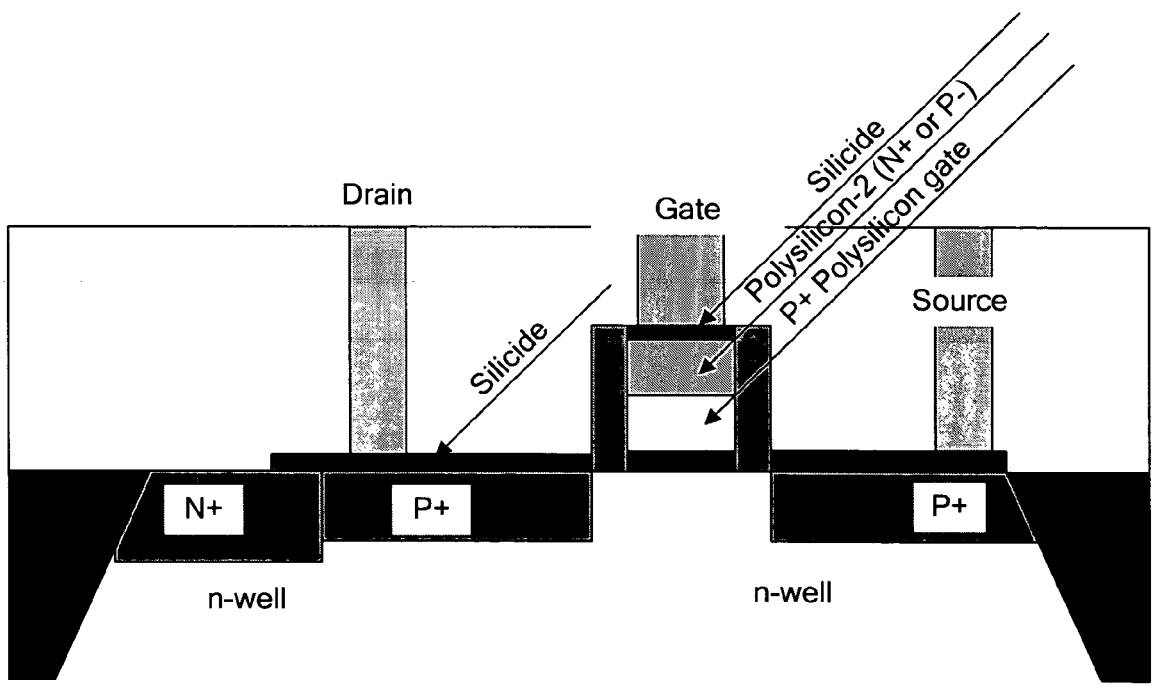
Figure 6C:
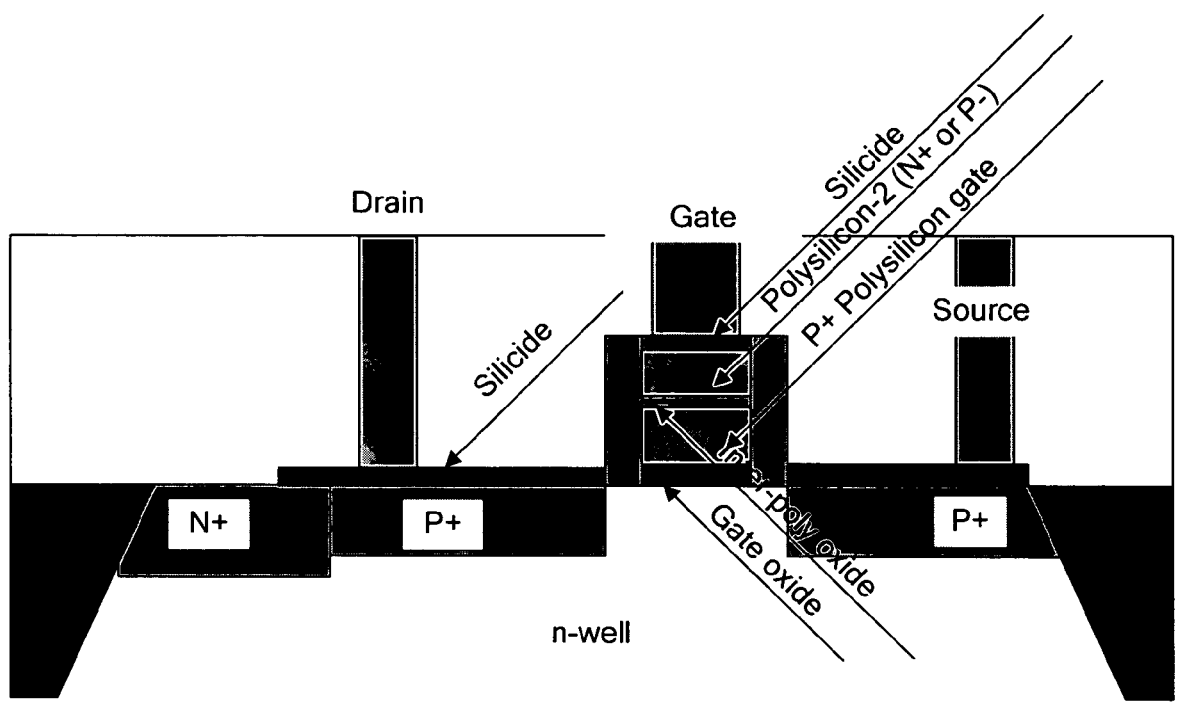

Reference is now made to FIG. 3 which shows an exemplary configuration of a NMOS transistor and a PMOS transistor, each with the diode connected to its respective gate in accordance with the disclosed invention. The diodes are designed to have a low forward drop (preferably less than 0.5 V) and a high reverse current (preferably greater than 1.0 mA/cm2). The diodes are connected in series with the gate of the respective transistor, in a direction depending on the type of the transistor. Specifically, for a NMOS transistor, the cathode of the diode is connected to the respective gate; for a PMOS transistor, the anode of the transistor is connected to the respective gate. As the transistor gate voltage increases, a fraction of the incident voltage drops across the diode and the rest drops across the gate-source junction of the respective transistor. This reduces the voltage at the gate of the respective transistor which, in turn, reduces the gate tunneling current. Referring to FIGS. 6A-6C, there are shown cross sections of NMOS (FIG. 6A) and PMOS (FIG. 6B) transistors with diodes manufactured in accordance with an exemplary implementation of the invention. A P-N diode or a Schottky diode may be created on the gate. In one embodiment (FIG. 6C) a leaky oxide may be used as a leakage reduction mechanism.

Figure 4:
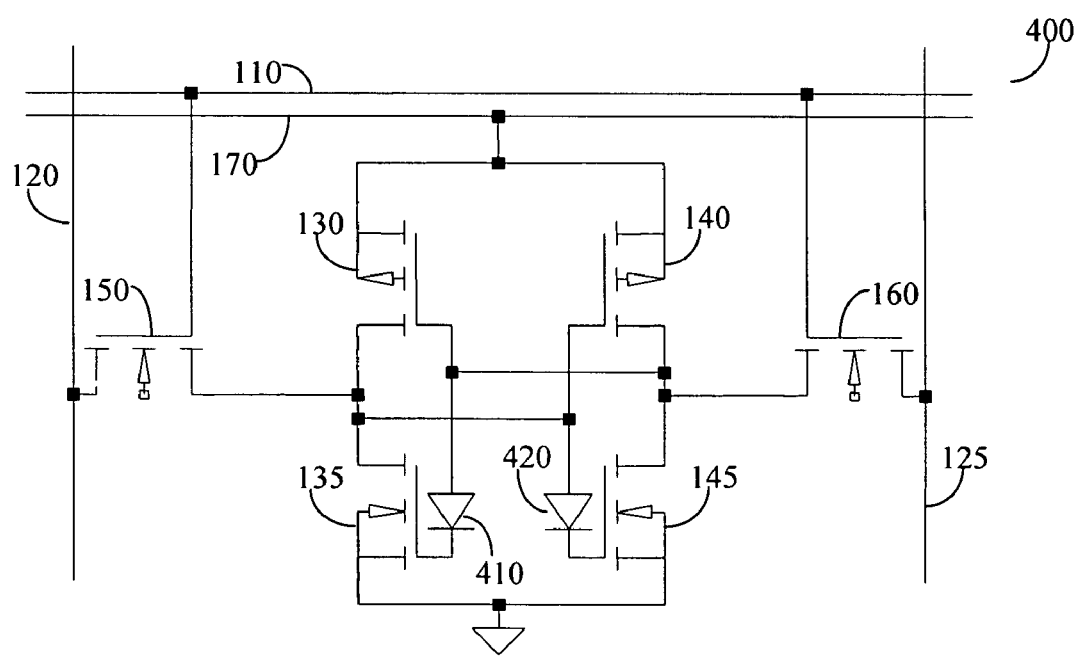
FIG. 4 shows a SRAM cell having a diode connected in series with the gate of the NMOS transistors in the inverter to reduce gate leakage.

Referring now to FIG. 4, there is shown an exemplary and non-limiting SRAM cell with diodes connected to the gate of the NMOS transistors in accordance with the invention. In accordance with an embodiment of the invention, diodes 410 and 420 are connected to the gates of NMOS transistors 135 and 145, respectively. In accordance with an alternate embodiment of the invention, a similar arrangement (not shown) with diodes connected to the gates of PMOS transistors 130 and 135 is provided. In yet another embodiment of the invention, diodes are connected with the gate of NMOS transistors 135 and 145 and PMOS transistors 130 and 140. These exemplary embodiments should be considered as mere illustrations of the possibilities of connecting the diodes to the gates of the transistors of the inverters of SRAM cell 400, and any other possible combination of the diodes connected to the transistors is specifically included. A person skilled-in-the-art would readily recognize the advantages of this invention where the two inverters are connected in a feedback circuit. This arrangement and the circuit elements allow the operation of the SRAM cell with minimal impact of the operation of the circuit. Reduction in the gate voltage also results in reduced gate tunneling current, in accordance with the main teaching of the invention.

Figure 5A:
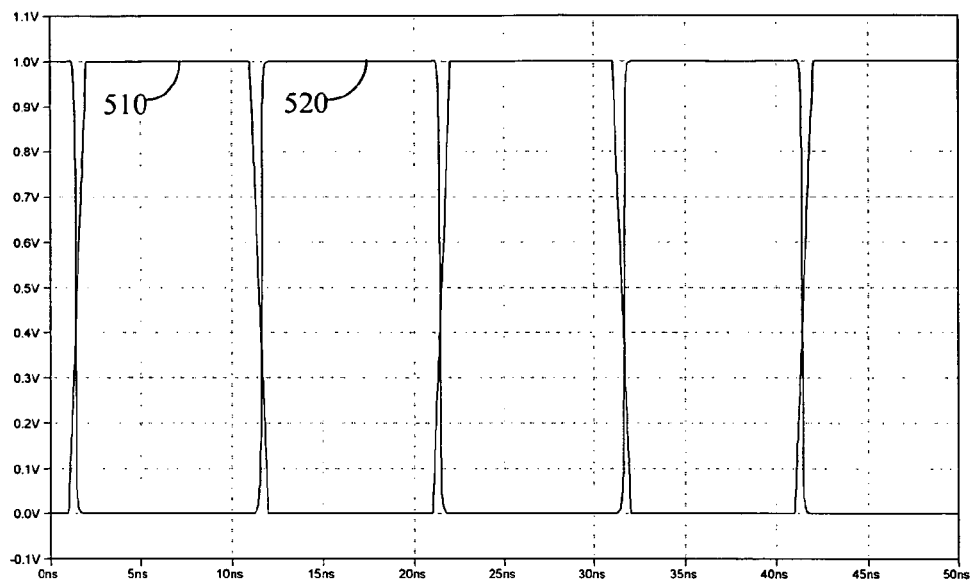
FIG. 5A shows a voltage waveform at the input and output of a CMOS inverter.
Figure 5B:
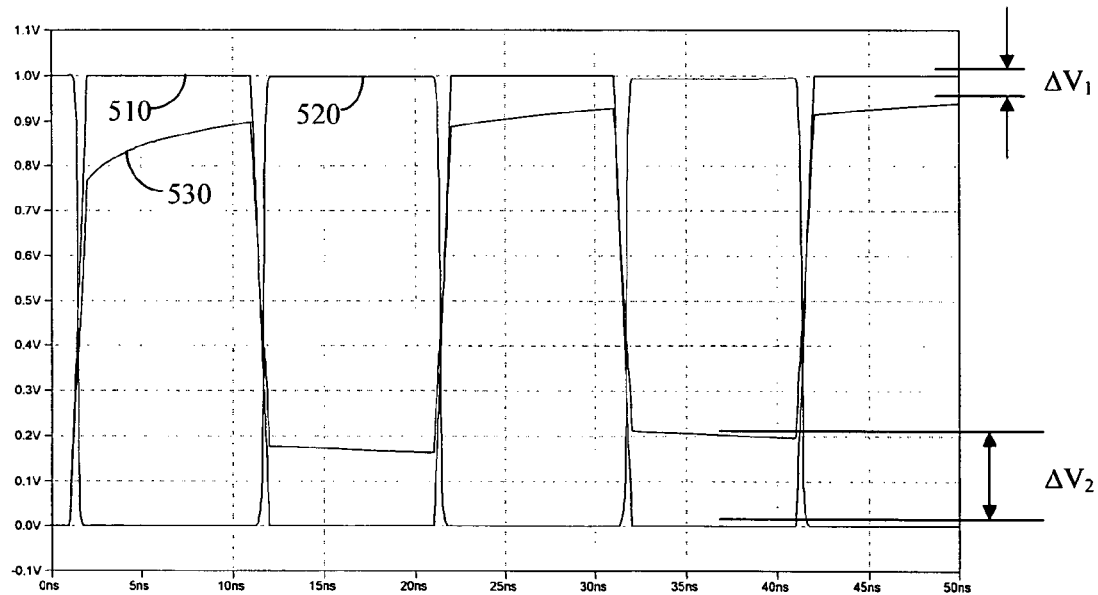
FIG. 5B shows a voltage waveform at the input and output of a CMOS inverter with diode coupled gate.

Reference is now made to FIGS. 5A and 5B where a voltage waveform of SRAM cells 100 and 400, respectively, is shown. The waveforms shown in FIGS. 5A and 5B are of simulation of the basic inverters formed by transistors 135 and 145. A pulse generator drives this circuit, and the output is measured at the common drain of transistors 135 and 145 as signals 510 and 520, respectively. FIG. 5B shows a voltage waveform at the input and output of a CMOS inverter with diode coupled gate. The voltage waveform at the gate of the NMOS transistor shows a reduced voltage swing. The drop in voltage across the diode is marked in the figure as ΔV.

The diode, for example diode 410, that is coupled to a gate of a transistor, for example transistor 135, may be realized by, but is not limited to, any one of the following implementations:

(a) A layer of P+ polysilicon on top of N+ polysilicon, which forms the gate of the transistor to realize a P-N diode in polysilicon for NMOS;

(b) A similar structure with polarities reversed to realize a diode in series with a PMOS gate;

(c) A Schottky diode realized by metal—N-type polysilicon on top of N+ gate polysilicon for NMOS transistors;

(d) A Schottky diode realized by metal—P-type polysilicon on top of P+ gate polysilicon for PMOS transistors;

(e) A lateral N+ to P+ polysilicon diode, as described in provisional patent applications 60/585,582, filed 7 Jul. 2004, and 60/601,979, filed 17 Aug. 2004, both documents being incorporated herein in their entirety by this reference thereto; or (f) An MOS capacitor formed with the layers of salicide and gate polysilicon layers as the electrodes and a thin layer of oxide as the dielectric the conduction through which takes place by a tunneling effect.

While the application of the invention is described herein primarily in reference to a SRAM cell, this is done as an example of the invention, and further due to the fact that this circuit configuration is one of the most common building blocks in very large scale integration (VLSI) circuits and it presents a fixed load for the transistors. The invention is not limited to the exemplary application and other uses are to be considered an integral part of the invention.

Although the invention has been described herein with reference to certain preferred embodiments, one skilled in the art will readily appreciate that other applications may be substituted for those set forth herein without departing from the spirit and scope of the present invention. Accordingly, the invention should only be limited by the claims included below.

The invention claimed is:

1. A method for forming a deep submicron circuit comprised of at least a plurality of metal-oxide-semiconductor (MOS) transistors, comprising the steps of:

fabricating a first active element;
fabricating a third active element coupled to said first active element;
fabricating a second active element coupled between said first active element and said third active element, said second active element enabled to reduce leakage current of said third active element and fabricated from abutting first material and second material, each of said first material and said second material having a different Fermi potential;
wherein for an NMOS transistor said second active element comprises a P—N diode in polysilicon fabricated by the step of:
adding a layer of a P+ polysilicon on top of an N+ polysilicon of the gate of said NMOS transistor.

2. A method for forming a deep submicron circuit comprised of at least a plurality of metal-oxide-semiconductor (MOS) transistors, comprising the steps of:
fabricating a first active element;
fabricating a third active element coupled to said first active element;
fabricating a second active element coupled between said first active element and said third active element, said second active element enabled to reduce leakage current of said third active element and fabricated from abutting first material and second material, each of said first material and said second material having a different Fermi potential;
wherein for a PMOS transistor said second active element comprises a P—N diode in polysilicon fabricated by the step of:
adding a layer of an N+ polysilicon on top of a P+ polysilicon of the gate of said PMOS transistor.

3. A method for forming a deep submicron circuit comprised of at least a plurality of metal-oxide-semiconductor (MOS) transistors, comprising the steps of:
fabricating a first active element;
fabricating a third active element coupled to said first active element;
fabricating a second active element coupled between said first active element and said third active element, said second active element enabled to reduce leakage current of said third active element and fabricated from abutting first material and second material, each of said first material and said second material having a different Fermi potential;
wherein for an NMOS transistor said second active element comprises a Schottky diode fabricated by the steps of:
applying an N-Type polysilicon on top of an N+ gate polysilicon of said NMOS transistor; and,
applying a metal layer on top of said N-Type polysilicon.

4. A method for forming a deep submicron circuit comprised of at least a plurality of metal-oxide-semiconductor (MOS) transistors, comprising the steps of:
fabricating a first active element;
fabricating a third active element coupled to said first active element;
fabricating a second active element coupled between said first active element and said third active element, said second active element enabled to reduce leakage current of said third active element and fabricated from abutting first material and second material, each of said first material and said second material having a different Fermi potential;
wherein for a PMOS transistor said second active element comprises a Schottky diode fabricated by the steps of:
applying a P-Type polysilicon on top of a P+ gate polysilicon of said PMOS transistor; and,
applying a metal layer on top of said P-Type polysilicon.

5. A method for forming a deep submicron circuit comprised of at least a plurality of metal-oxide-semiconductor (MOS) transistors, comprising the steps of:
fabricating a first active element;
fabricating a third active element coupled to said first active element;
fabricating a second active element coupled between said first active element and said third active element, said second active element enabled to reduce leakage current of said third active element and fabricated from abutting first material and second material, each of said first material and said second material having a different Fermi potential;
wherein fabrication of said second active element comprises the step of:
forming a lateral N+ to P+ polysilicon diode.

6. A method for forming a deep submicron circuit comprised of at least a plurality of metal-oxide-semiconductor (MOS) transistors, comprising the steps of:
fabricating a first active element;
fabricating a third active element coupled to said first active element;
fabricating a second active element coupled between said first active element and said third active element, said second active element enabled to reduce leakage current of said third active element, said second active element comprises a MOS capacitor fabricated by the steps of:
forming a first electrode and a second electrode from salicide layers and gate polysilicon layers; and
forming a dielectric from a thin layer of oxide between said first electrode and said second electrode.

7. A static random access memory (SRAM) cell with current leakage protection comprising:
a first inverter comprising a PMOS and NMOS transistors;
a second inverter comprising a PMOS and NMOS transistors, the input of the second inverter directly coupled to the output of said first inverter and the output of said second inverter directly coupled to the input of said first inverter;
a first element coupled between the gate of the PMOS transistor of said first inverter and the gate of the NMOS transistor of said first inverter, the first element enabled to reduce leakage current of the NMOS transistors of said first inverter; and
a second element coupled between the gate of the PMOS transistor of said second inverter and the gate of the NMOS transistor of said second inverter, the second element enabled to reduce leakage current of the NMOS transistor of said first inverter and said second inverter.

8. The SRAM cell of claim 7, wherein at least one of said first element and said second element comprises abutting first material and second material, each of said first material and said second material having a different Fermi potential.

9. The SRAM cell of claim 7, wherein at least one of said first element and said second element forms a rectifying junction.

10. The SRAM cell of claim 7, wherein at least one of said first element and said second element is formed over the gate of at least one of said first active element and said second active element.

11. The SRAM cell of claim 7, wherein at least one of said first element and said second element is a MOS capacitor having electrodes formed from salicide layers and gate polysilicon layers, and having a dielectric between the electrode formed from a thin layer of oxide.

* * * * *